United States Patent
Jeong et al.

(10) Patent No.: US 9,064,750 B2
(45) Date of Patent: Jun. 23, 2015

(54) DISPLAY SUBSTRATE AND METHOD OF MANUFACTURING THE SAME

(71) Applicant: Samsung Display Co., LTD., Yongin, Gyeonggi-Do (KR)

(72) Inventors: Yu-Gwang Jeong, Anyang-si (KR); Ji-Young Park, Hwaseong-si (KR); Shin-Il Choi, Hwaseong-si (KR); Sang-Gab Kim, Seoul (KR)

(73) Assignee: SAMASUNG DISPLAY CO., LTD. (KR)

( * ) Notice: Subject to any disclaimer, the term of this patent is extended or adjusted under 35 U.S.C. 154(b) by 0 days.

(21) Appl. No.: 13/869,697

(22) Filed: Apr. 24, 2013

(65) Prior Publication Data

US 2014/0159059 A1 Jun. 12, 2014

(30) Foreign Application Priority Data

Dec. 10, 2012 (KR) .................. 10-2012-0142461

(51) Int. Cl.
| | |
|---|---|
| H01L 29/786 | (2006.01) |
| H01L 27/13 | (2006.01) |
| G02F 1/1345 | (2006.01) |
| H01L 27/12 | (2006.01) |
| G02F 1/1337 | (2006.01) |
| H01L 33/02 | (2010.01) |

(52) U.S. Cl.
CPC ........ *H01L 27/124* (2013.01); *G02F 1/133707* (2013.01); *H01L 27/1288* (2013.01); *H01L 27/1248* (2013.01)

(58) Field of Classification Search
CPC .............. H01L 27/124; H01L 27/1248; H01L 27/1288; H01L 33/02; G02F 1/133707
USPC ........ 438/22, 29, 30, 34, 623; 257/59, 72, 79, 257/88, 759, E33.062, E29.288, E27.06, 257/E21.582, E21.001; 349/129, 130, 149
See application file for complete search history.

(56) References Cited

U.S. PATENT DOCUMENTS

| | | | | |
|---|---|---|---|---|
| 7,796,228 | B2 * | 9/2010 | Kim et al. ............... | 349/149 |
| 8,570,473 | B2 * | 10/2013 | Li et al. ................. | 349/130 |
| 2011/0089421 | A1 * | 4/2011 | Choi et al. ............... | 257/59 |

FOREIGN PATENT DOCUMENTS

| | | |
|---|---|---|
| JP | 2007310334 | 11/2007 |
| KR | 0867866 | 11/2008 |
| KR | 1020120043387 | 4/2012 |

\* cited by examiner

*Primary Examiner* — Dao H Nguyen
(74) *Attorney, Agent, or Firm* — Innovation Counsel LLP

(57) ABSTRACT

A method of manufacturing a display substrate includes forming a gate insulation layer on the base substrate on which a gate metal pattern, forming a data metal pattern on the gate insulation layer, sequentially forming a insulation layer and an organic layer on the base substrate on which the data metal pattern is formed, partially exposing the organic layer, developing the organic layer to partially remove the organic layer on the data metal pattern and to expose at least a portion of the protecting layer on the gate metal pattern, forming a common electrode on the organic layer, forming a pixel electrode on the on the organic layer, and forming an insulation layer between the pixel electrode and the common electrode. An etching degree of a data metal may be controlled by controlling a thickness of a remained organic layer to reduce a damage of the data metal.

13 Claims, 12 Drawing Sheets

DISPLAY SUBSTRATE AND METHOD OF MANUFACTURING THE SAME

PRIORITY STATEMENT

This application claims priority under 35 U.S.C. §119 to Korean Patent Application No. 10-2012-0142461, filed on Dec. 10, 2012 in the Korean Intellectual Property Office (KIPO), the contents of which are incorporated by reference herein in its entirety.

BACKGROUND OF THE INVENTION

1. Field of the Invention

Exemplary embodiments of the present invention relate to a display substrate and a method of manufacturing the display substrate. More particularly, exemplary embodiments of the present invention relate to a display substrate including an organic layer and a method of manufacturing the display substrate.

2. Description of the Related Art

Generally, a display device includes a first display substrate, a second display substrate opposite the first display substrate and a liquid crystal layer disposed between the first display substrate and the second display substrate.

The first display substrate includes a gate line, a data line, a switching element connected to the gate line and the data line, a gate insulation layer disposed on a gate electrode of the switching element, a protecting layer disposed on source and drain electrodes of the switching element and partially exposing the drain electrode and a pixel electrode electrically connected to the switching element.

The pixel electrode is formed over the gate line or the data line. The pixel electrode may overlap with the gate line or the data line, or be spaced apart from the gate line or the data line. Thus, the parasitic capacitance between the pixel electrode and the gate line or the data line may be generated.

The first display substrate may further comprise an organic layer to increase a distance between the pixel electrode and the gate line or the data line, so that the parasitic capacitance between the pixel electrode and the gate line or the data line may be reduced.

In this case, the organic layer and the protecting layer under the organic layer are patterned to form a contact hole, to thereby forming an under-cut. Thus, the pixel electrode formed along the contact hole may be disconnected, so that the reliability of the display device may be deteriorated.

Additionally, as an ashing process is performed on the organic layer to remove the under-cut, a processing time may increase, and a surface of the organic layer may be rough. Thus, the pixel electrode formed on the organic layer may be disconnected, so that the display device may generate persistence of vision.

Further, because a metal is consumed, a yield may be lowered and a reliability of a display apparatus may be deteriorated.

SUMMARY OF THE INVENTION

Exemplary embodiments of the present invention provide a display substrate capable of improving a display device.

Exemplary embodiments of the present invention also provide a method of manufacturing the display substrate.

In an exemplary embodiment of a display substrate according to the present invention, the display substrate includes a base substrate, a switching element disposed on the base substrate, the switching element including a gate electrode, a source electrode and a drain electrode, a protecting layer disposed on the base substrate on which the switching element is disposed, the protecting layer partially exposing the drain electrode, an organic layer disposed on the protecting layer, the organic layer exposing the drain electrode, a common electrode disposed on the organic layer, a first insulation layer disposed on the organic layer on which the common electrode is formed, the first insulation layer exposing the drain electrode and a pixel electrode disposed on the first insulation layer, the pixel electrode electrically connected to the drain electrode through a first through hole formed on the protecting layer, the organic layer and the first insulation layer.

In an exemplary embodiment, the display substrate may further include a data line extending from the source electrode and a signal pad extending from the data line, and the protecting layer may be disposed on the signal pad, and the signal pad is exposed through a second through hole formed on the protecting layer and the organic layer.

In an exemplary embodiment, the display substrate may further include a common line including substantially the same material as the gate electrode and a second insulation layer disposed on the common line, and the common line may be exposed through a third through hole formed on the protecting layer, the second insulation layer and the organic layer.

In an exemplary embodiment, the pixel electrode disposed in the first through hole may be connected with a side surface of the protecting layer and a side surface of the first insulation layer.

In an exemplary embodiment, the pixel electrode disposed in the first through hole may be connected with a side surface of the protecting layer, a side surface of the organic layer and a side surface of the first insulation layer.

In an exemplary embodiment, the drain electrode may be formed with a material including a molybdenum.

In an exemplary embodiment, a thickness of the drain electrode may be more than 50 Å.

In an exemplary embodiment of a method of manufacturing a display substrate, the method includes forming a gate insulation layer on the base substrate including a gate metal pattern formed thereon, forming a data metal pattern on the gate insulation layer, sequentially forming a insulation layer and an organic layer on the base substrate on which the data metal pattern is formed, partially exposing the organic layer, developing the organic layer to partially remove the organic layer on the data metal pattern and to expose at least a portion of the protecting layer on the gate metal pattern, forming a common electrode on the organic layer; forming a pixel electrode on the on the organic layer; and forming an insulation layer between the pixel electrode and the common electrode.

In an exemplary embodiment, the method may further include removing the protecting layer and the gate insulation layer overlapped with the gate metal pattern to expose the gate metal pattern.

In an exemplary embodiment, the method may further include after removing the protecting layer, performing an ashing process to expose at least a portion of the protecting layer on the data metal pattern.

In an exemplary embodiment, forming a common electrode comprises, after performing an ashing process, forming a first transparent electrode layer covering the exposed gate metal pattern; and patterning the first transparent electrode layer to form the common electrode.

In an exemplary embodiment, the method may further include after forming the common electrode, sequentially forming an insulation layer and a photoresist layer and patterning the insulation layer to expose the data metal pattern.

In an exemplary embodiment, the pixel electrode is electrically connected to the data metal pattern.

In an exemplary embodiment, the pixel electrode may be overlapped with the common electrode.

In an exemplary embodiment, a mask partially exposing the organic layer may be a half-tone, a slit mask or a reflow mask.

In an exemplary embodiment, the data metal pattern comprises a molybdenum.

In an exemplary embodiment, a thickness of the data metal pattern may be more than 50 Å.

In an exemplary embodiment, the forming a common electrode comprises, after developing the organic layer, forming a first transparent electrode layer covering the organic layer and patterning the first transparent electrode to form a common electrode.

In an exemplary embodiment, the method may further include after forming the insulation layer, forming a photoresist layer pattern; and etching the insulation layer, the protecting layer, the organic layer and the gate insulation layer to expose portions of the gate metal pattern, common electrode and the data metal pattern.

In an exemplary embodiment, the forming a pixel electrode comprises forming a connecting electrode connecting the gate metal pattern and the common electrode.

According to a display substrate and a manufacturing the same, an organic layer on the data metal pattern is partially removed using a partial exposure, so that an consumption of an surface of the data metal pattern may be decreased.

In addition, an etching degree of a data metal may be controlled by controlling a thickness of a remained organic layer to reduce a damage of the data metal. Therefore, the reliability of a display substrate may be improved.

BRIEF DESCRIPTION OF THE DRAWINGS

The above and other features and advantages of the present invention will become more apparent by describing in detailed exemplary embodiments thereof with reference to the accompanying drawings, in which.

DETAILED DESCRIPTION OF THE INVENTION

Hereinafter, the present invention will be explained in detail with reference to the accompanying drawings.

Figure 1:
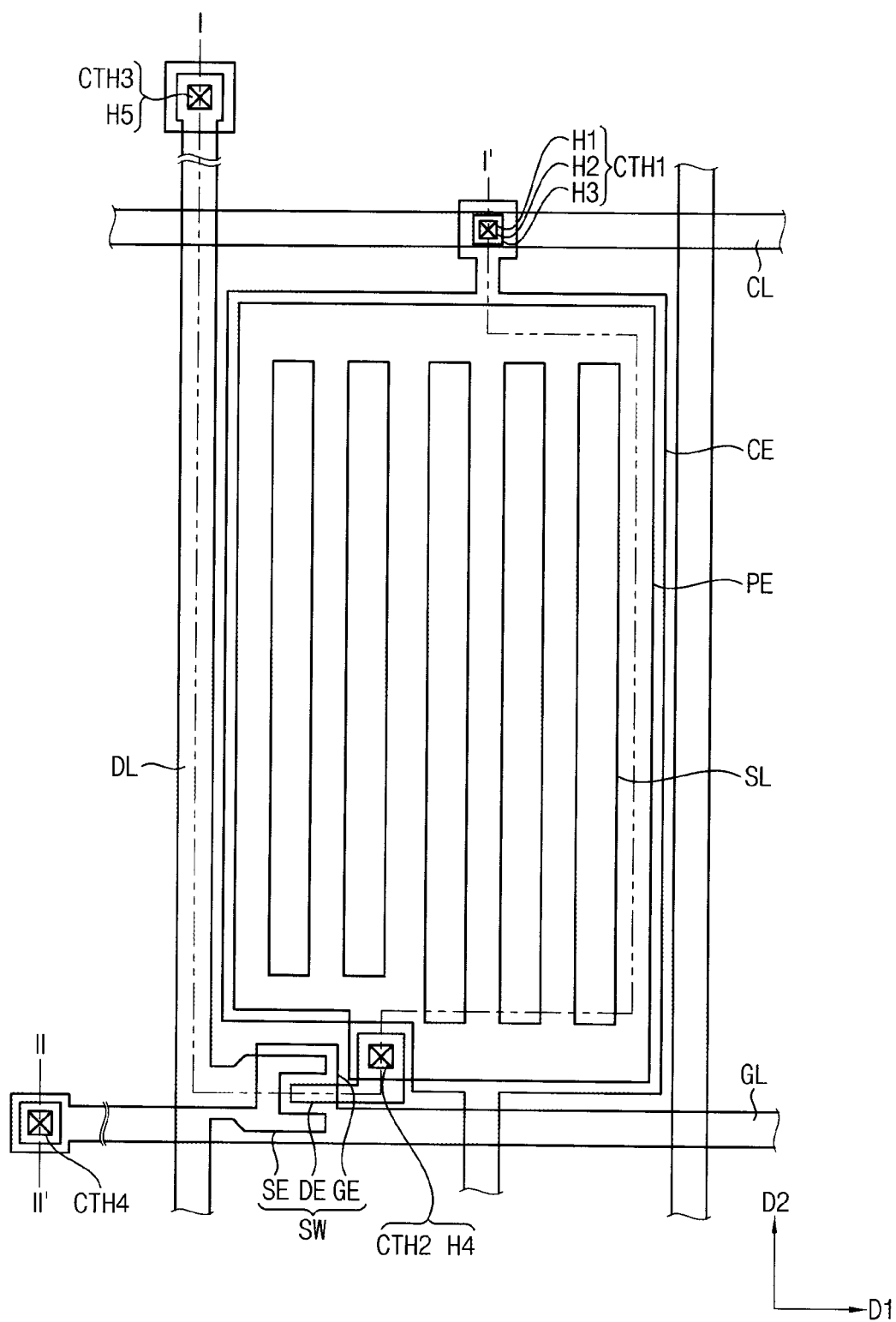
FIG. 1 is a plan view illustrating a display substrate according to an exemplary embodiment of the present invention.
Figure 2:
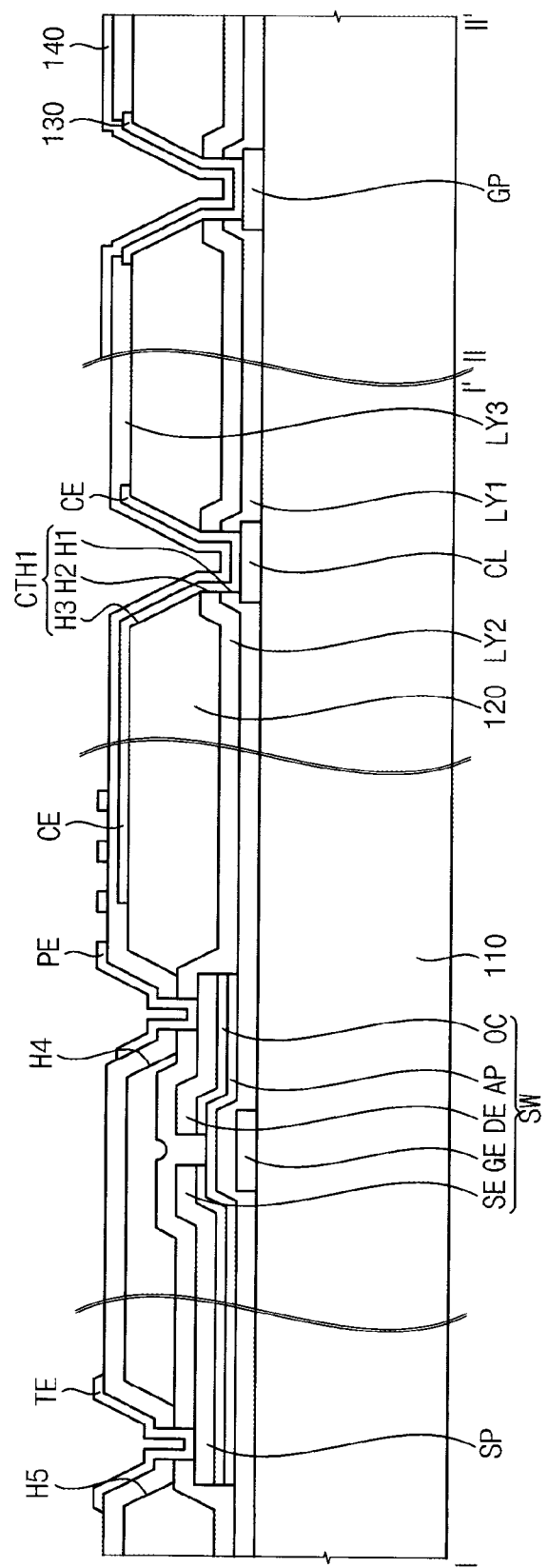
FIG. 2 is a cross-sectional view illustrating the display substrate taken along a line I-I' and II-II' of FIG. 1.

FIG. 1 is a plan view illustrating a display substrate according to an exemplary embodiment of the present invention. FIG. 2 is a cross-sectional view taken along the line I-I' and II-II' of FIG. 1.

Referring to FIGS. 1 and 2, a display substrate according to the present exemplary embodiment includes a base substrate 110, a gate line GL, a data line DL, a switching element SW, a signal pad SP, a common line CL, a pad electrode GP, a common electrode CE, a pixel electrode PE, a first electrode 130, a second electrode 140, a gate insulation layer LY1, a protecting layer LY2, an organic layer 120 and an pixel insulation layer LY3, which are disposed on the base substrate 110.

The gate line GL is disposed on the base substrate 110 and extends in a first direction D1. The data line DL extends in a second direction D2 crossing the first direction D1. The gate line GL is insulated from the data line DL by the gate insulation layer LY1.

The switching element SW includes a gate electrode GE extended from the gate line GL, a source electrode SE extended from the data line DL and a drain electrode DE disposed over the gate electrode GE and spaced apart form the source electrode SE. The switching element SW may further include an active pattern AP and an ohmic contact layer OC disposed between the gate electrode GE and the source/drain electrode SE and DE. The active pattern AP may include an amorphous silicon. The ohmic contact layer OC may include a heavily doped amorphous silicon.

The signal pad SP extends from an end of the data line DL. The signal pad SP is connected to a data driving part and provides a data signal to the data line DL.

The common line CL may extend in the first direction D1. The common line CL may include substantially the same material as the gate line GL. The common line CL may receive a common voltage from the external device.

A gate pad part is formed at an end of the gate line GL. The gate pad part may include a pad electrode GP, a first electrode 130 and a second electrode 140. The pad electrode GP extends from an end of the gate line GL. The pad electrode GP may include a same material as the gate line GL. The first electrode 130 may be disposed on the pad electrode GP. The first electrode 130 may be formed as a transparent conductive layer. The first electrode 130 may be formed in the same layer as the common electrode CE. The first electrode 130 covers the pad electrode GP, so that in the process of etching the protection layer LY2 and the pixel insulation layer LY3 over the data metal pattern, the first electrode 130 prevents the gate metal pattern from being damaging. The second electrode 140 may be formed in the same layer as the pixel electrode PE. Thus, the first electrode 130 and the second electrode 140 are sequentially disposed on the pad electrode GP.

The common electrode CE is disposed adjacent to the switching element SW. The pixel electrode PE is disposed over the common electrode CE, and overlaps with the common electrode CE. The common electrode CE is insulated from the pixel electrode PE by the pixel insulation layer LY3.

The common electrode CE is electrically connected to the common line CL through a first contact hole CTH1. Thus, the common electrode CE may receive the common voltage from the common line CL.

The pixel electrode PE may extend and be in parallel with the data line DL. The pixel electrode PE is electrically connected to the drain electrode DE through a second contact hole CTH2. Thus, the pixel electrode PE may receive the data voltage from the data line DL.

The display substrate may further include a connecting electrode TE electrically connected to the signal pad SP through a third contact hole CTH3. The connecting electrode TE connects the signal pad SP and the data driving part. The connecting electrode TE may extend along the contact hole CTH3 and on the organic layer 120.

The gate insulation layer LY1 is disposed between a gate pattern including the gate line GL, a gate electrode GE and the common line CL and a data pattern including the data line DL, source and drain electrodes SE and DE and a signal pad SP. The gate insulation layer LY1 insulates between the gate pattern and the data pattern.

The gate insulation layer LY1 includes a first hole H1 partially exposing the common line CL. The first hole H1 may have a first area A1 in a plan view. The first hole H1 may have a first width W1 in a cross-sectional view.

The protecting layer LY2 is disposed on the data pattern, and the organic layer 120 is disposed on the protecting layer LY2. The protecting layer LY2 may include silicon nitride (SiNx). The protecting layer LY2 may protect the data pattern.

The protecting layer LY2 includes a second hole H2 exposing the common line CL exposed by the first hole H1. The second hole H2 overlaps with the first hole H1. The second hole H2 may have a second area A2 substantially the same as the first area A1 in a plan view. The second hole H2 may have a second width W2 substantially the same as the first width W1 in a cross-sectional view.

The organic layer 120 includes a third hole H3 exposing the common line CL exposed by the first and second holes H1 and H2. The third hole H3 overlaps with the first and second holes H1 and H2. The third hole H3 may have a third area A3 substantially same as the first area A1 in a plan view. The third hole H3 may have a third width W3 substantially same as the first width W1 in a cross-sectional view.

In addition, the protecting layer LY2 includes a fourth hole H4 partially exposing the drain electrode DE. The fourth hole H4 may have a fourth area A4 in a plan view. The fourth hole H4 may have a fourth width W4 in a cross-sectional view.

In addition, the protecting layer LY2 includes a fifth hole H5 partially exposing the signal pad SP. The fifth hole H5 may have a fifth area A5 in a plan view. The fifth hole H5 may have a fifth width W5 in a cross-sectional view.

The first, the second and the third holes H1, H2 and H3 form the first contact hole CTH1. The fourth hole H4 forms the second contact hole CTH2. The fifth hole H5 forms the third contact hole CTH3.

FIGS. 3 to 7 are cross-sectional views illustrating a method of manufacturing the display substrate according to an exemplary embodiment of the present invention.

Figure 3:
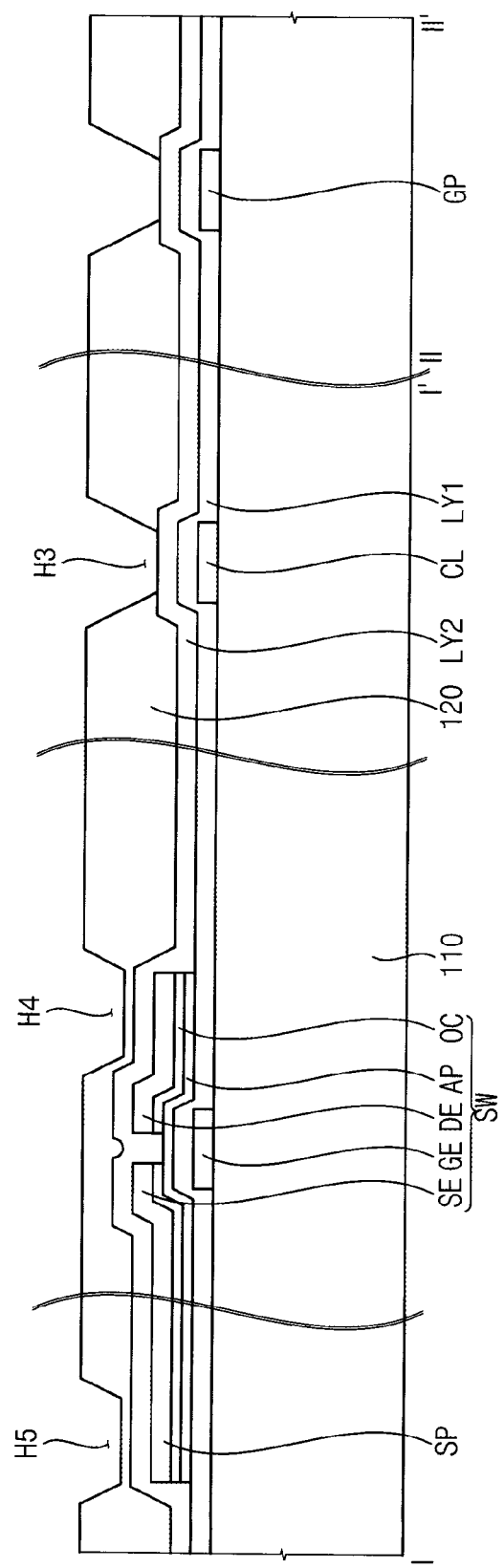
FIGS. 3 to 7 are cross-sectional views illustrating a method of manufacturing the display substrate according to an exemplary embodiment of the present invention.

Referring to FIG. 3, a gate metal pattern is formed on the base substrate 110. Specifically, the gate metal layer is formed on the base substrate 110, the gate metal layer is patterned using a mask to form the gate line GL, the gate electrode GE extending from the gate line GL, the common line CL substantially parallel to the gate line GL and the pad electrode GP formed in an end of the gate line GL. Although it is not shown, the storage line may be further formed on the base substrate 110.

Then, the gate insulation layer LY1, the active pattern AP and a data metal pattern are formed on the base substrate 110 on which the gate metal pattern is formed. Specifically, the gate insulation layer LY1, a semiconductor layer and a data metal layer are sequentially formed on the base substrate 110 on which the gate metal pattern is formed. The semiconductor layer and the data metal layer are patterned using a mask to form the data line DL crossing the gate line GL, the active pattern AP overlapping with the gate electrode GE, the source electrode SE, the drain electrode DE and the signal pad SP extending from the data line. The data metal pattern includes the source electrode SE, the drain electrode DE and the signal pad SP extending from the data line. The data metal pattern may include a molybdenum or a copper.

Then, the protecting layer LY2 and the organic layer 120 are sequentially formed on the base substrate 110 on which the data metal pattern is formed. The organic layer 120 is patterned using a mask, to form the third, fourth and fifth holes H3, H4 and H5. The third hole H3 partially exposes a portion of the protecting layer LY2 overlapping with the common line CL. The fourth and the fifth holes H4 and H5 overlap with the drain electrode DE and the signal pad SP respectively. In the process of forming the fourth and fifth holes H4 and H5, a partial exposure process is performed, such that portions of the organic layer remains over the protection layer LY2 overlapped with the drain electrode DE and the signal pad SP. The mask may be a half-tone mask, a slit mask or a reflow mask.

Figure 4:
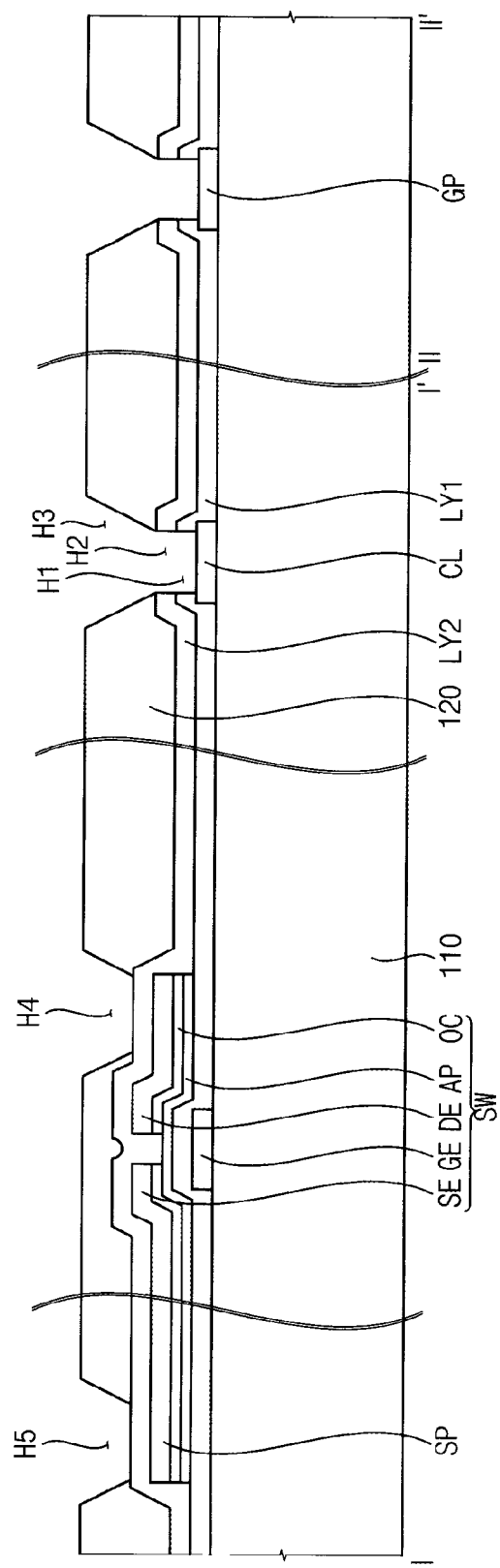

Referring to FIG. 4, the protecting layer LY2 exposed by the third hole H3 is etched using the organic layer 120 as a etch mask to form the second hole H2 exposing the gate insulation layer LY1 overlapping with the common line CL. The gate insulation layer LY1 exposed by the second hole H2 is etched using the organic layer 120 and the protection layer LY2 as a etch mask to form the first hole H1 exposing the common line CL. Through this process, the second hole H2 may be over-etched than the third hole H3, so that undercut may be generated. Thus, an ashing process may be performed to remove the organic layer 120 on the undercut. In the process of the ashing, the remaining portion of the organic layer in the fourth and fifth holes H4 and H5 is removed, so that the protection layer LY2 overlapped with the drain electrode DE and the signal pad SP is partially exposed. In a conventional process, because the insulation layer on the common electrode including the protecting layer and the gate insulation layer, and the insulation layer on the drain electrode including the protecting layer are etched at the same time, a surface of the drain electrode is damaged due to the difference in the thickness of the insulation layers. However, in an exemplary embodiment of the present invention, an upper molybdenum of the drain electrode may be not damaged because it is protected by the remained organic layer on the drain electrode.

Figure 5:
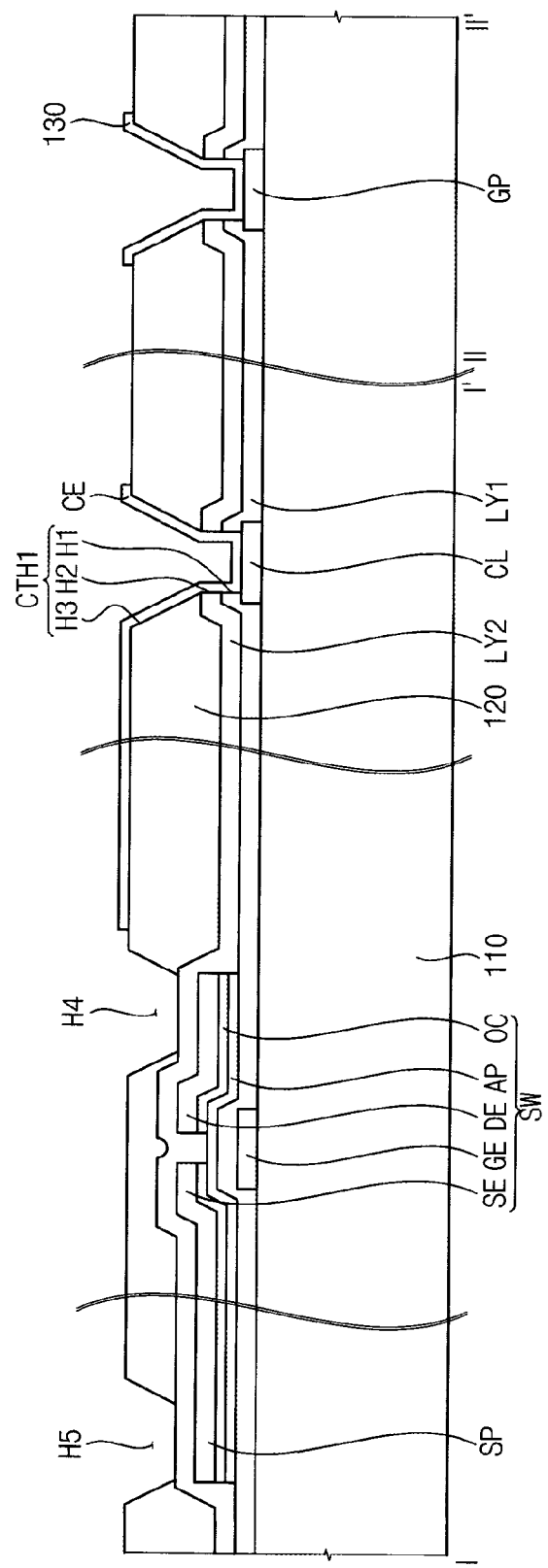

Referring to FIG. 5, after the ashing process is performed, a first transparent electrode layer is formed to cover the exposed common line CL. In the process of etching the protection layer LY2 and the pixel insulation layer LY3 over the data metal pattern, the first transparent electrode layer prevents the gate metal pattern from being damaging. The first transparent electrode layer is patterned using a mask to form the common electrode CE electrically connected to the common line CL. A first electrode 130 is disposed on the pad electrode GP. The first electrode 130 covers the pad electrode GP, so that in the process of etching the protection layer LY2 and the pixel insulation layer LY3 over the data metal pattern, the first electrode 130 prevents the gate metal pattern from being damaging.

Figure 6:
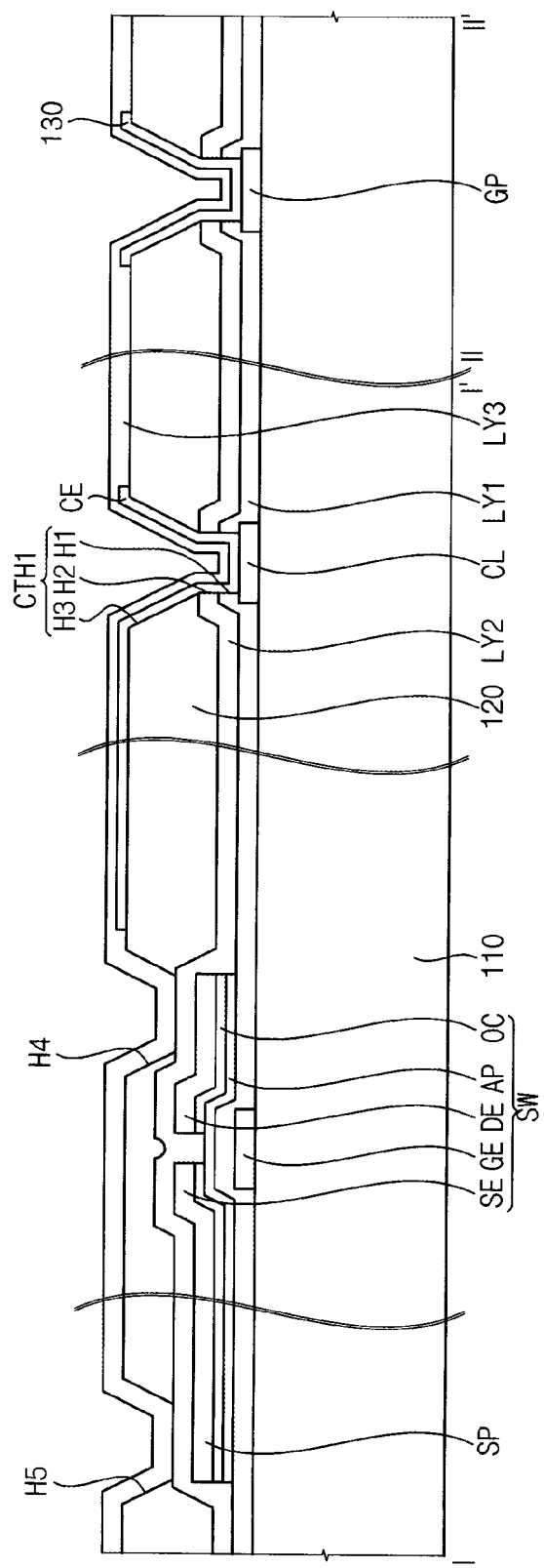
Figure 7:
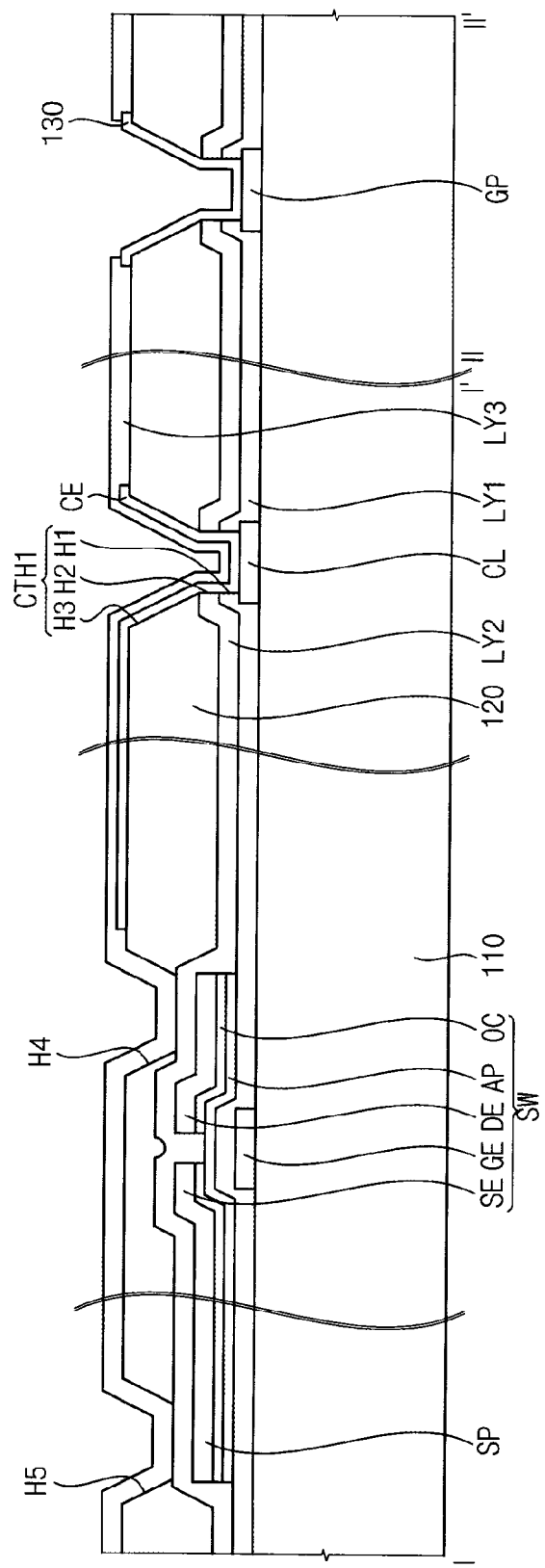

Referring to FIGS. 6 and 7, the pixel insulation layer LY3 is formed on the base substrate 110 on which the first transparent electrode layer is formed. The pixel insulation layer LY3 is patterned using a mask to partially expose the data metal pattern. The data metal pattern may include the drain electrode DE and the signal pad SP. In an exemplary embodiment of the present invention, as compared with the conventional process, only an additional time for etching the protecting layer LY2 is needed without an additional process, so that a time loss may be minimized A thickness of the data metal pattern may be more than 50 Å.

A second transparent electrode layer is formed on the base substrate on which the data metal pattern is partially exposed. The second transparent electrode is patterned, so that a pixel electrode PE and a connecting electrode TE electrically connected with the data metal pattern is formed. The second transparent electrode is patterned, so that the second electrode 140 electrically connected with the first electrode 130 is formed.

According to the present exemplary embodiment, a portion of the upper organic layer of the data metal pattern remains due to a partial exposure, so that an upper surface of the data metal pattern may not be damaged.

In addition, according to the present exemplary embodiment, only a half-tone pattern is added to a mask and no additional process is necessary.

Figure 8:
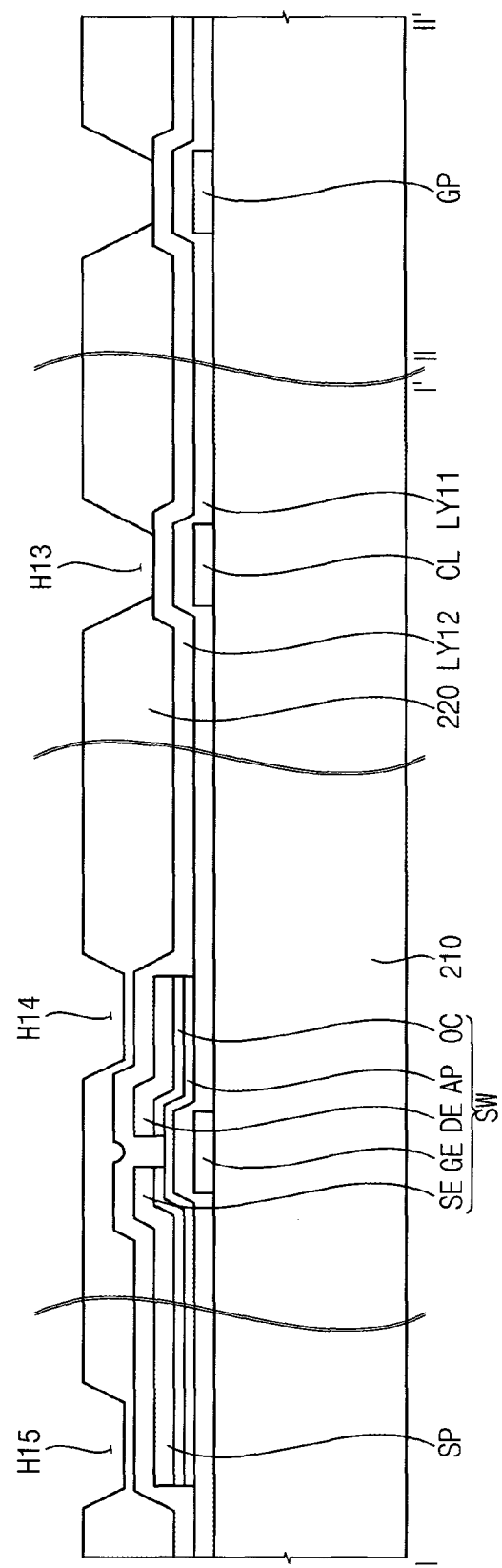
FIGS. 8 to 12 are cross-sectional views illustrating a method of manufacturing the display substrate according to another exemplary embodiment of the present invention.

FIGS. 8 to 12 are cross-sectional views illustrating a method of manufacturing the display substrate according to another exemplary embodiment of the present invention Referring to FIG. 8, a gate metal pattern is formed on the base substrate 210. Specifically, the gate metal layer is formed on the base substrate 110, the gate metal layer is patterned using a mask to form and then the gate line GL, the gate electrode GE extended from the gate line GL, the pad electrode GP extended from the gate line GL and the common line CL substantially parallel to the gate line GL. Although not shown, the storage line may be further formed on the base substrate 210.

Then, the gate insulation layer LY11, the active pattern AP and a data metal pattern are formed on the base substrate 210 on which the gate metal pattern is formed. Specifically, the gate insulation layer LY11, a semiconductor layer and a data metal layer are sequentially formed on the base substrate 210 on which the gate metal pattern is formed. The semiconductor layer and the data metal layer are patterned using a mask to form the data line DL crossing the gate line GL, the active pattern AP overlapping with the gate electrode GE, the source electrode SE, the drain electrode DE and the signal pad SP extending from the data line. The data metal pattern includes the source electrode SE, the drain electrode DE and the signal pad SP extending from the data line. The data metal pattern may include a molybdenum.

Then, the protecting layer LY12 and the organic layer 220 are sequentially formed on the base substrate 210 on which the data metal pattern is formed. The organic layer 220 is patterned using a mask to form the third, fourth and fifth holes H3, H4 and H5. In the process of forming the fourth and the fifth holes H4 and H5, a partial exposure is performed, so that a portion of the organic layer is remains over the protection layer LY2 overlapped with the drain electrode DE and the signal pad SP. The mask may be a half-tone mask, a slit mask or a reflow mask.

Figure 9:
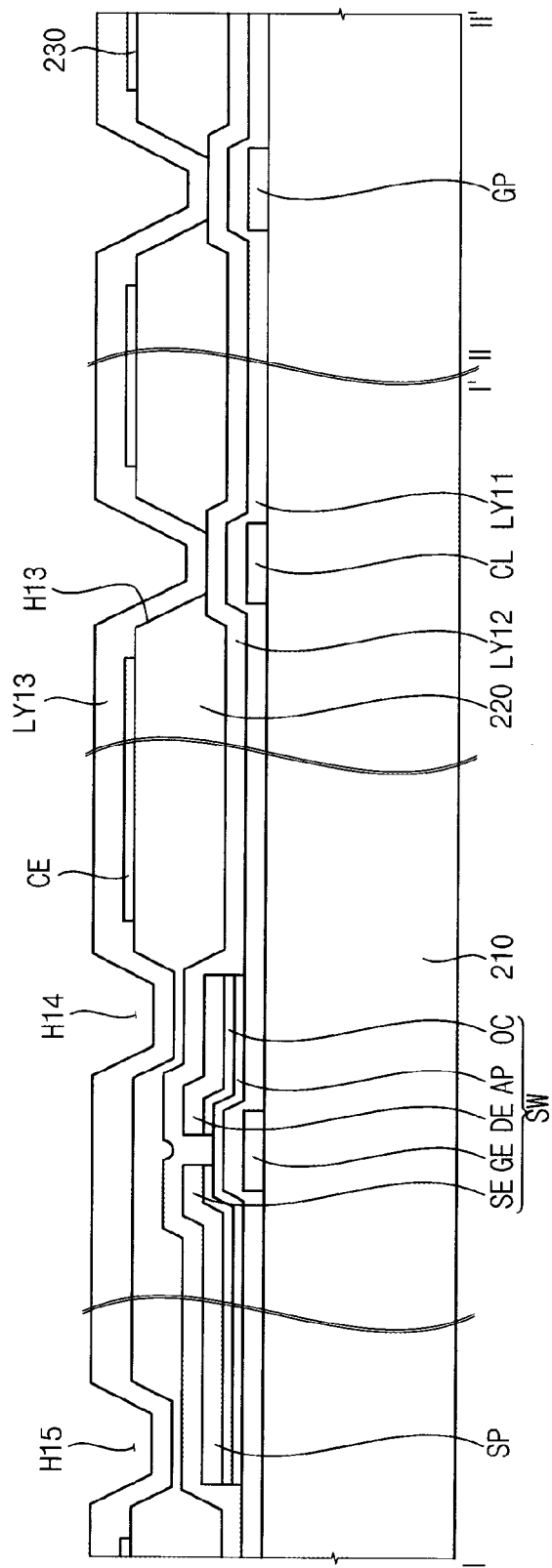

Referring to FIG. 9, a first transparent electrode layer is formed on the base substrate 210 on which the third, fourth and fifth holes H3, H4 and H5 are formed. And then, the first transparent electrode layer is patterned to form a common electrode CE and the first electrode 230. At this time, the protecting layer LY12 is not etched. The pixel insulation layer LY13 and a first photoresist layer are sequentially formed on the base substrate 210 on which the common electrode CE is formed. The protection layer LY12, the portion of the organic layer remained due to the partial exposure and the pixel insulation layer LY13 are sequentially stacked over the drain electrode DE and the signal pad SP.

Figure 10:
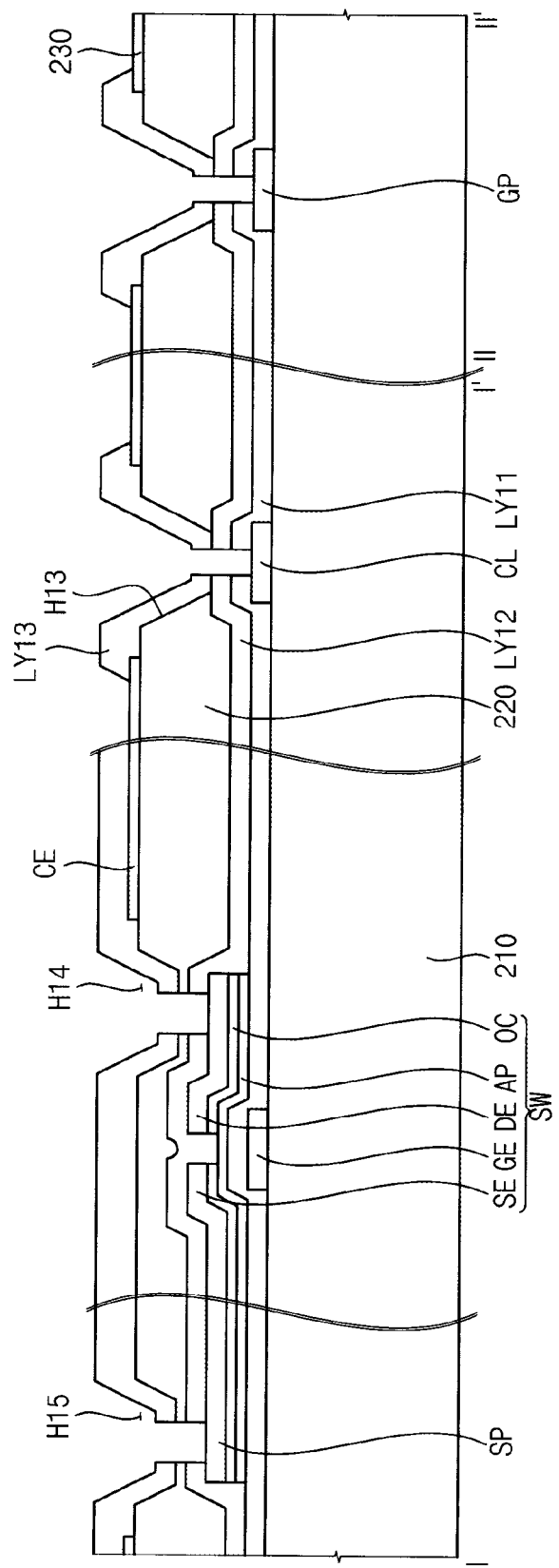

Referring to FIG. 10, the pixel insulation layer LY13 is patterned, so that the common line CL, the drain electrode DE, the signal pad SP, the common electrode CE and the first electrode 230 are partially exposed. In the process of patterning the pixel insulation layer LY13, the protection layer LY12 and the pixel insulation layer LY13 are etched all together. A thickness of the data metal pattern may be more than 50 Å.

Figure 11:
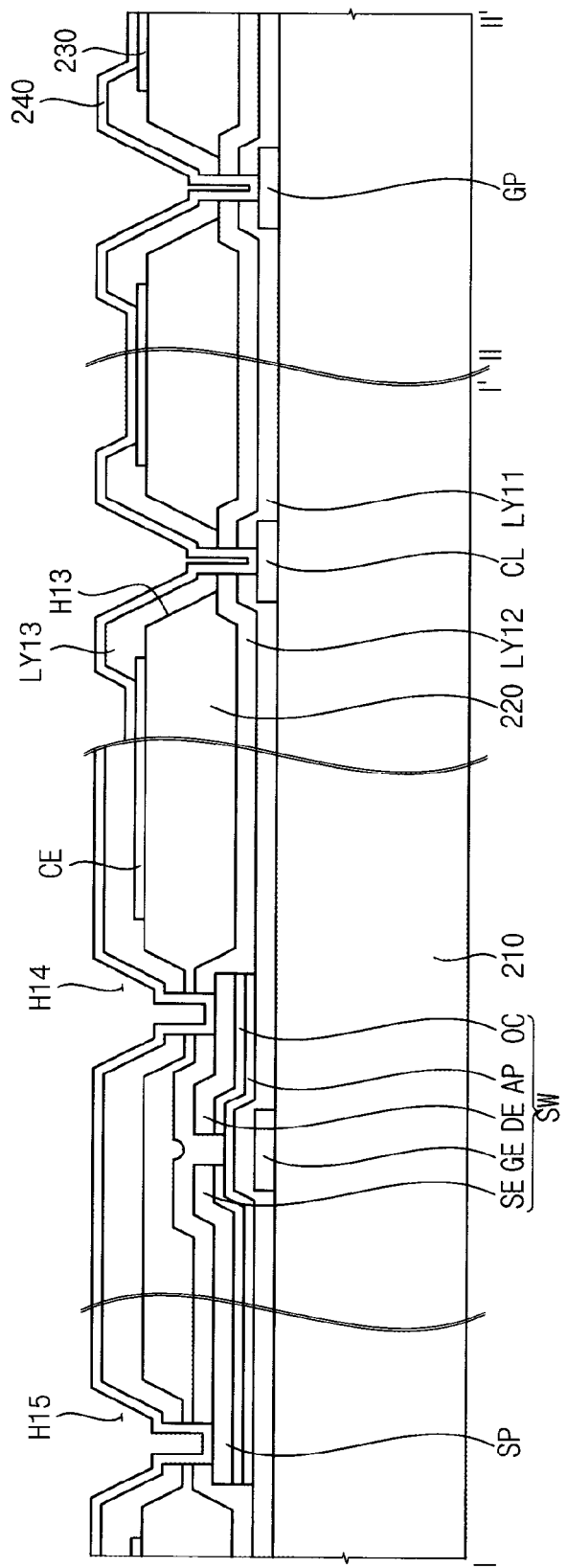

Referring to FIG. 11, a second transparent electrode layer and a second photoresist layer are sequentially formed on the base substrate 210 on which the common line CL, the drain electrode DE, the signal pad SP and the common electrode CD are partially exposed. The second transparent electrode layer and the second photoresist layer are patterned to form a pixel electrode PE electrically connected to the data metal pattern and the connecting electrode TE connecting between the common electrode CE and the common line CL.

Figure 12:
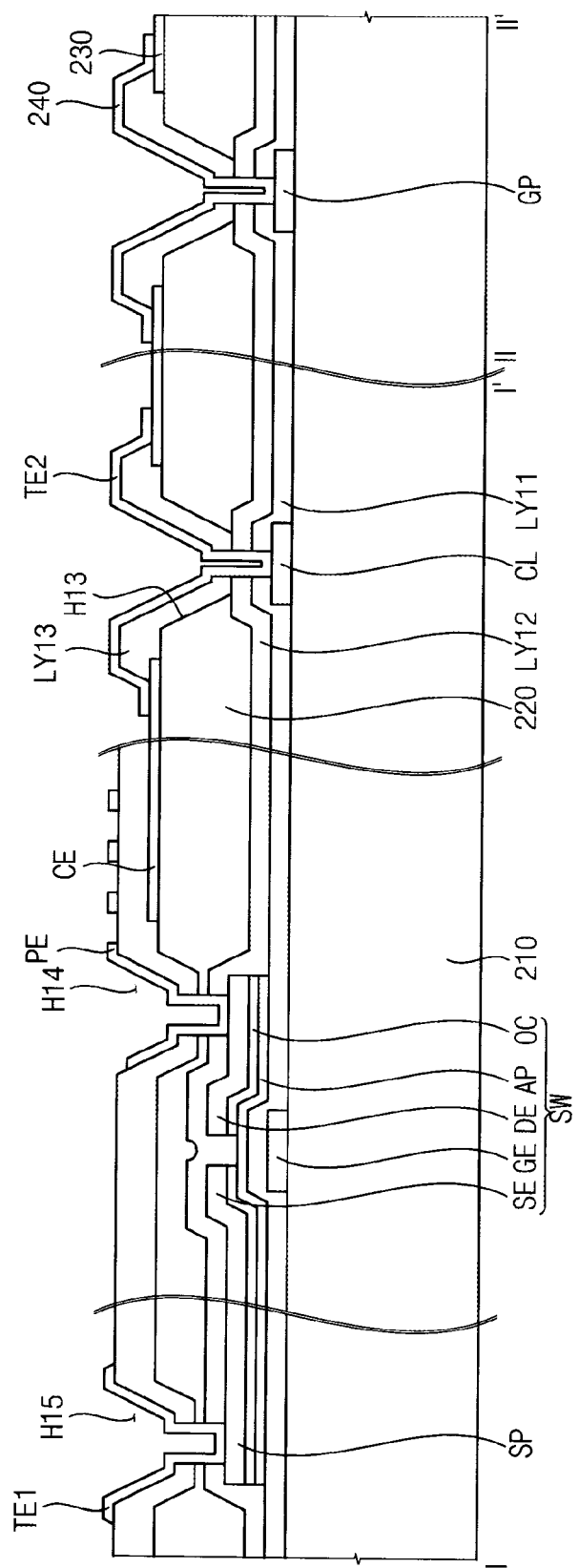

Referring to FIG. 12, the transparent electrode layer is patterned, so that a pixel electrode PE electrically connected to the data metal pattern and the connecting electrode TE connecting between the common electrode CE and the common line CL are formed. The transparent electrode layer is patterned, so that the second electrode 240 electrically connected with the first electrode 230 is formed.

According to the present exemplary embodiment, an etching degree of a data metal pattern may be controlled by controlling a thickness of a remained organic layer, so that a damage of an upper metal of the data metal pattern may be decreased.

In the present exemplary embodiment, the active pattern of the display substrate includes an amorphous silicon. However, in another exemplary embodiment, the active pattern of the display substrate may include an oxide semiconductor. In addition, in the present exemplary embodiment, the display substrate includes thin film transistor with bottom gate. However, in another exemplary embodiment, the display substrate may include thin film transistor with top gate.

According to a display substrate and a manufacturing the same, an organic layer on the data metal pattern is partially removed due to a partial exposure, so that a damage of an upper surface of the data metal pattern may be decreased.

In addition, an etching degree of a data metal pattern may be controlled by controlling a thickness of a remained organic layer according to the thickness of the gate insulation layer, so that a damage of an upper metal of the data metal pattern may be decreased. Therefore, the reliability of a display substrate may be improved.

The foregoing exemplary embodiments are illustrative examples of the present invention and is not to be construed as limiting thereof. Although a few exemplary embodiments of the present invention have been described, those skilled in the art will readily appreciate that many modifications are possible in the exemplary embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific example embodiments disclosed, and that modifications to the disclosed example embodiments, as well as other example embodiments, are intended to be included within the scope of the appended claims. The present invention is defined by the following claims, with equivalents of the claims to be included therein.

What is claimed is:

1. A method of manufacturing a display substrate, the method comprising:
    forming a gate insulation layer on the base substrate including a gate metal pattern formed thereon;
    forming a data metal pattern on the gate insulation layer;
    sequentially forming a protection layer and an organic layer on the base substrate on which the data metal pattern is formed;
    partially exposing the organic layer;

developing the organic layer to partially remove the organic layer on the data metal pattern and to completely remove the organic layer on the gate metal pattern;

forming a common electrode on the organic layer; forming a pixel electrode on the organic layer; and forming an insulation layer on the organic layer, the insulation layer being disposed between the pixel electrode and the common electrode.

2. The method of claim 1, further comprising:

removing the protecting layer and the gate insulation layer overlapped with the gate metal pattern to expose the gate metal pattern.

3. The method of claim 2, further comprising:

after removing the protecting layer and the gate insulation layer, performing an ashing process to expose at least a portion of the protecting layer on the data metal pattern.

4. The method of claim 3, wherein forming a common electrode comprises, after performing an ashing process, forming a first transparent electrode layer covering the exposed gate metal pattern; and patterning the first transparent electrode layer to form the common electrode.

5. The method of claim 3, wherein forming the insulation layer comprises, after forming the common electrode, sequentially forming an insulator and a photoresist layer; and patterning the insulator to expose the data metal pattern.

6. The method of claim 5, wherein the pixel electrode is electrically connected to the data metal pattern.

7. The method of claim 6, wherein the pixel electrode is overlapped with the common electrode.

8. The method of claim 1, wherein a mask partially exposing the organic layer is a half-tone, a slit mask or a reflow mask.

9. The method of claim 1, wherein the data metal pattern comprises a molybdenum.

10. The method of claim 1, wherein a thickness of the data metal pattern is more than 50 Å.

11. The method of claim 1, wherein the forming a common electrode comprises, after developing the organic layer, forming a first transparent electrode layer covering the organic layer; and patterning the first transparent electrode to form a common electrode.

12. The method of claim 11, further comprising:

after forming the insulation layer, forming a photoresist layer pattern; and etching the insulation layer, the protecting layer, the organic layer and the gate insulation layer to expose portions of the gate metal pattern, common electrode and the data metal pattern.

13. The method of claim 12, wherein the forming a pixel electrode comprises forming a connecting electrode connecting the gate metal pattern and the common electrode.

* * * * *